United States Patent [19]

Sugawa et al.

[11] Patent Number: 4,827,260
[45] Date of Patent: May 2, 1989

[54] DIGITAL-TO-ANALOG CONVERTER

[75] Inventors: Naoki Sugawa; Tetsuya Iida, both of Yokohama, Japan

[73] Assignee: Kabushiki Kaisha Toshiba, Kawasaki, Japan

[21] Appl. No.: 162,264

[22] Filed: Feb. 29, 1988

[30] Foreign Application Priority Data

Mar. 4, 1987 [JP]  Japan .................................. 62-47734

[51] Int. Cl.$^4$ .................................................. H03M 1/66
[52] U.S. Cl. .................................... 341/118; 341/144; 341/145
[58] Field of Search ........................ 341/118, 144, 145

[56] References Cited

U.S. PATENT DOCUMENTS 3,739,375 6/1973 Chatelon et al. ............ 340/347 AD
4,523,182 6/1985 Harvey et al. ............... 340/347 DA

OTHER PUBLICATIONS

Shen et al., "A 60ns Glitch-Free NMOS Dac," IEEE International Solid-State Circuits Conference Digest of Technical Papers, pp. 188-189 1983.

Primary Examiner—William M. Shoop, Jr.
Assistant Examiner—Helen Goh
Attorney, Agent, or Firm—Finnegan, Henderson, Farabow, Garrett, & Dunner

[57] ABSTRACT

A digital-to-analog converter of current segment type, having a plurality of first variable current sources and a second variable current source of the same structure as the first variable current sources. The converter further comprises a comparator. The comparator compares a voltage corresponding to the output current of the second variable current source with a reference voltage. The difference between these compared voltages is used to determine the output currents of the first variable current sources.

6 Claims, 3 Drawing Sheets

DIGITAL-TO-ANALOG CONVERTER

BACKGROUND OF THE INVENTION

1. Field of the Invention

The present invention relates to a digital-to-analog converter for converting digital signals to analog signals, and more particularly, to a digital-analog converter for use in an apparatus, such as a video signal-processing apparatus, in which signals must be processed at high speed.

2. Description of the Related Art

Most video signal-processing apparatuses includes a high-speed D/A (digital-analog) current-segment type converter. This type of converter comprises a plurality of constant current sources each having a switch connected thereto. When the D/A converter is designed to convert an n-bit digital signal to an analog signal, it then comprises $2^n-1$ current sources and $2^n-1$ switches. This is because an n-bit digital signal is changed into $2^n$ decoded outputs, and the current supply from all constant current sources must be stopped when all bits of the input digital signal are "0".

The $2^n-1$ switches are selectively turned on in accordance with the results of the decoding of the digital signal. Therefore, the value of the analog output of the current-segment type D/A converter increases by the output current of one current source when the content of the input digital signal increases by one.

The full scale of the analog output of such a D/A converter, i.e., the output range from the minimum value to the maximum value, is determined by the structure of the device, or the output current values of the current sources. Once the D/A converter has been manufactured, its full-scale value cannot be altered. Consequently, the use of the D/A converter is limited.

Since the output current of each current source changes with variations in the ambient temperature and/or the power-supply voltage, the analog output of this type of D/A converter therefore tends to be unstable during operation. As a result, this D/A converter can hardly achieve a high-accuracy D/A conversion of signals.

SUMMARY OF THE INVENTION

Accordingly, it is the object of the present invention to provide a D/A converter whose output full-scale value can be easily altered, whose D/A-conversion accuracy is not influenced by variations in the ambient temperature and/or the power-supply voltage, and which can therefore be versatile and accomplish high-accuracy D/A conversion of signals.

According to this invention, there is provided a digital-analog converter comprising a digital-analog converting circuit including a plurality of serial circuits, each of which has a switch device and a first variable current source capable of supplying currents of different values, a second variable current source of substantially the same structure as the first variable current source, a current-to-voltage converting means for converting the output current of the second variable current source to a voltage corresponding to the output current, and a comparator for comparing the output voltage of the current-to-voltage converter with a reference voltage. The serial circuits are connected in series to a plurality of current paths, respectively. These current paths are provided between a power-supply potential terminal and an output terminal. The digital-analog converting circuit converts an input digital signal to an analog signal as the switch devices are selectively turned on in accordance, with the input digital signal. The second variable current source is connected at its one terminal to the power-supply potential terminal. The difference between the voltages compared by the comparator determines the level of the output currents of the first and second variable current sources.

Since the output of the comparator controls the output current of the second variable current source such that the voltage-generating element generates a voltage equal to the reference voltage, the output current of the second variable current source is sufficiently stable. Such that the first variable current source is identical in structure to the second variable current source, the output current of the first variable current source therefore corresponds to the reference voltage. The D/A converter of this invention can present an analog output which is not influenced by variations in the ambient temperature or in the power-supply voltage, and which is therefore stable. When the level of the reference voltage is changed, the output current of the first variable current source changes proportionally. Thus, the full scale of the analog output of the D/A converter can be easily changed to any desired value.

DETAILED DESCRIPTION OF THE PREFERRED EMBODIMENTS

Figure 1:
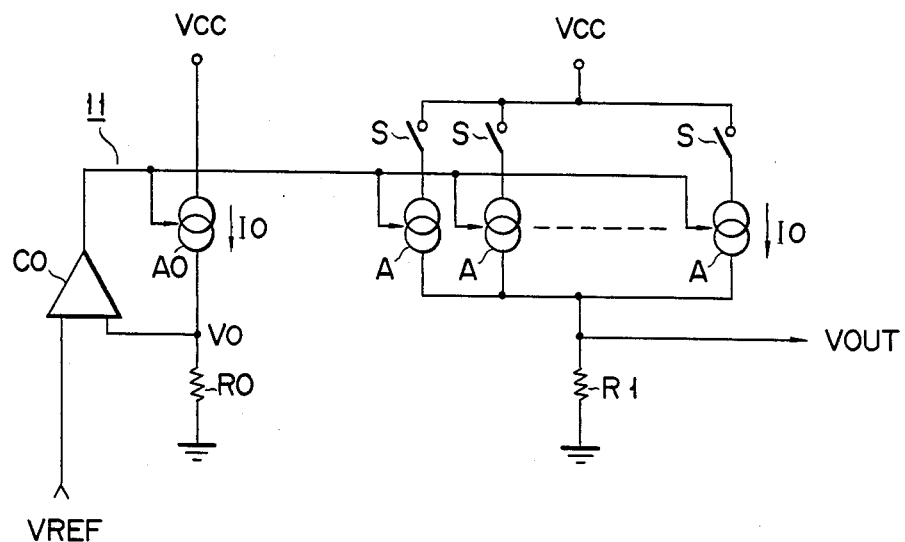
FIG. 1 is a circuit diagram showing a digital-analog converter according to a first embodiment of this invention.

FIG. 1 shows a D/A converter according to a first embodiment of the invention. This D/A converter is a current-segment type, designed to convert an n-bit digital signal to an analog signal, and, as is shown in FIG. 1, comprises $2^n-1$ variable current sources A, and $2^n-1$ switch devices S connected in series to sources A, respectively. Thus, variable current sources A and switch devices S form $2^n-1$ series circuits. Each of these series circuits is coupled between a power-supply terminal VCC and an output terminal VOUT. Switch devices S are selectively turned on or off by the outputs obtained by decoding the n-bit digital signal input to the D/A converter. Resistor R1 is connected at one end to variable current sources A, and changes the output current of each current source A into output voltage VOUT. Resistor R1 can, however, be omitted, in which case the output analog data of the D/A converter is then a current. The D/A converter further comprises control circuit 11 for controlling the output currents I0 of variable current sources A.

Control circuit 11 comprises a variable current source A0, resistor R0, and voltage comparator C0. Variable current source A0 is of the same structure as variable current sources A, and along with resistor R0, is connected in series between power-supply terminal VCC and the ground. The potential V0 at the node of current source A0 and resistor R0 is applied to the first input terminal of voltage comparator C0, reference voltage VREF being applied to the second input terminal thereof.

Figure 2:
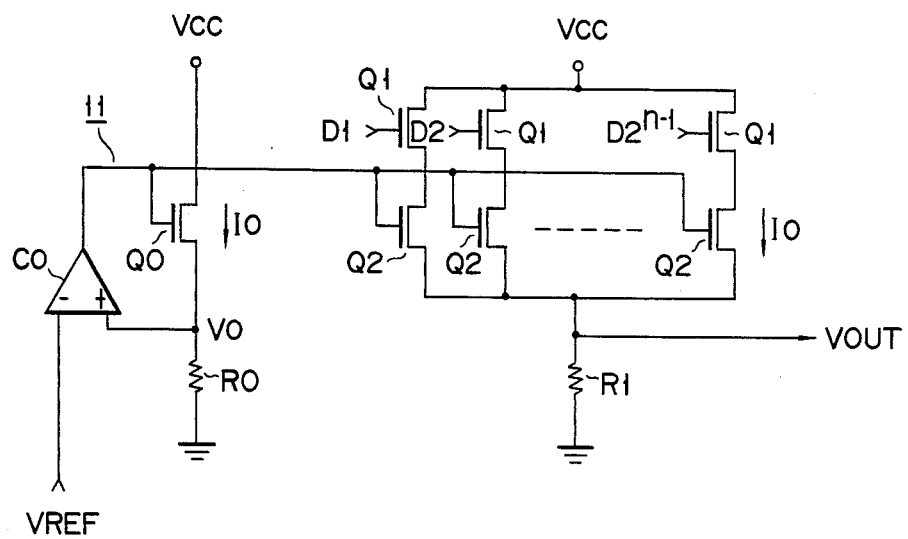
FIG. 2 is a circuit diagram illustrating the digital-analog converter of FIG. 1 in greater detail, in particular, showing the switch devices and the current sources of the converter.

FIG. 2 shows the above D/A converter in greater detail. As is illustrated in this figure, each switch device S is a P-type MOS transistor Q1, each variable current source A is a P-type MOS transistor Q2, and the variable current source A0 of control circuit 11 is also a P-type MOS transistor, Q0. P-type MOS transistors Q0 and Q2 are both the same size and are formed on the same semiconductor chip. Outputs D1 to D$2^n-1$ which have been obtained by decoding the n-bit digital signal, are supplied one to each of the gates of P-type MOS transistors Q1. The gate of P-type MOS transistor Q0, and the gates of P-type MOS transistors Q2 are coupled to the output of comparator C0. Since P-type MOS transistor Q0 is used as a variable current source, a reference voltage is applied to the inverting input of comparator C0, with voltage V0 being applied to the non-inverting input thereof. As a result, the current I0 which flows through transistor Q0 can be controlled so as to maintain voltage V0 equal to I-:eren-voltage VREF, even if the ambient temperature or the power-supply potential VCC change. Since $V0=I0 \cdot R0$, current I0 is therefore given as follows:

$$I0 = VREF/R0$$

When k P-type MOS transistors Q1 are turned on in accordance with the outputs obtained by decoding the digital signal, output voltage VOUT is given as:

$$VOUT = k \cdot I0 \cdot R1$$

Thus: $VOUT = k \cdot R1 \cdot VREF/R0$
where $0 < k < 2^n - 1$.

Therefore, the D/A converter can output the voltage VOUT which is determined by reference voltage VREF and resistors R0 and R1 only, irrespective of the current I0 flowing through transistor Q0 of control circuit 11. In other words, the D/A converter can perform a stable digital-analog conversion, which is not influenced by variations in the ambient temperature or in power-supply voltage VCC. Furthermore, the full scale of the analog output can be easily changed to a desired value merely by altering reference voltage VREF.

Figure 3:
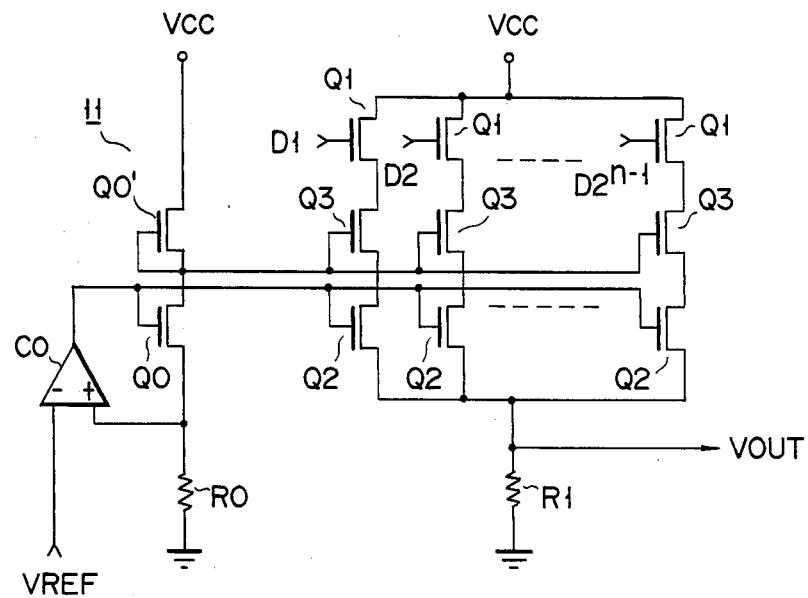
FIG. 3 is a circuit diagram showing a modification of the digital-analog converter shown in FIG. 2.

FIG. 3 illustrates a modification of the D/A converter shown in FIG. 2. The D/A converter of FIG. 3 differs from the converter of FIG. 2 in two principal respects. First, variable current source A0 comprises two P-type MOS transistors, Q0' and Q0, connected in series. Secondly, each variable current source A is made up of two P-type MOS transistors, Q2 and Q3, again connected in series. The gates of P-type MOS transistors Q0 and Q2 are coupled to the output of comparator C0, the gate and drain of P-type MOS transistor Q0' are connected to each other, and the node of the gate and drain of transistor Q0' is connected to the gates of P-type MOS transistors Q3.

Since each variable current source has the specific structure described above, P-type MOS transistors Q0' and Q3 function as loads of P-type MOS transistors Q0 and Q2. Therefore, the variable current source can output a current more stable than the variable current source used in the D/A converter shown in FIG. 2, which includes only one transistor.

Figure 4:
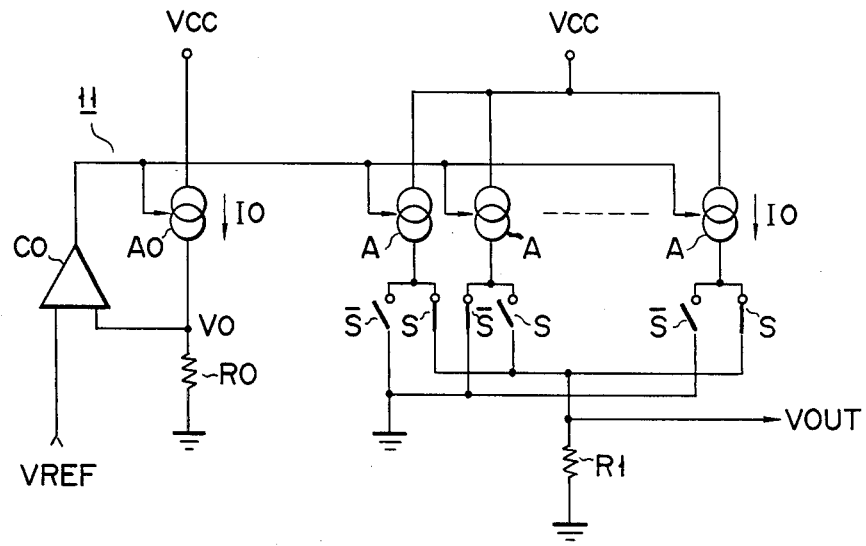
FIG. 4 is a circuit diagram representing a digital-analog converter according to a second embodiment of the invention.

FIG. 4 shows a D/A converter according to a second embodiment of the invention. This D/A converter has two switch devices, S and $\bar{S}$, connected to each variable current source A. More specifically, one end of switch device S is coupled to variable current source A, and its other end is coupled to output terminal VOUT. One end of switch device $\bar{S}$ is coupled to variable current source A, and its other end to the ground. The $2^n-1$ decoded outputs obtained by decoding an input digital signal are supplied to the $2^n-1$ switch devices $\bar{S}$, respectively, thereby turning on or off these switch devices. These $2^n-1$ decoded outputs are inverted by inverters (not shown) and supplied to $2^n-1$ switches S, respectively, thereby turning on or off these switch devices. Hence, each variable current source A is always connected to either output terminal VOUT or to the ground, regardless of the results of the decoding the digital signal. The D/A converter of FIG. 4 can operate at a speed higher than the D/A converter of the first embodiment, in which some time elapses until the output current of each variable current source increases to a predetermined value.

Figure 5:
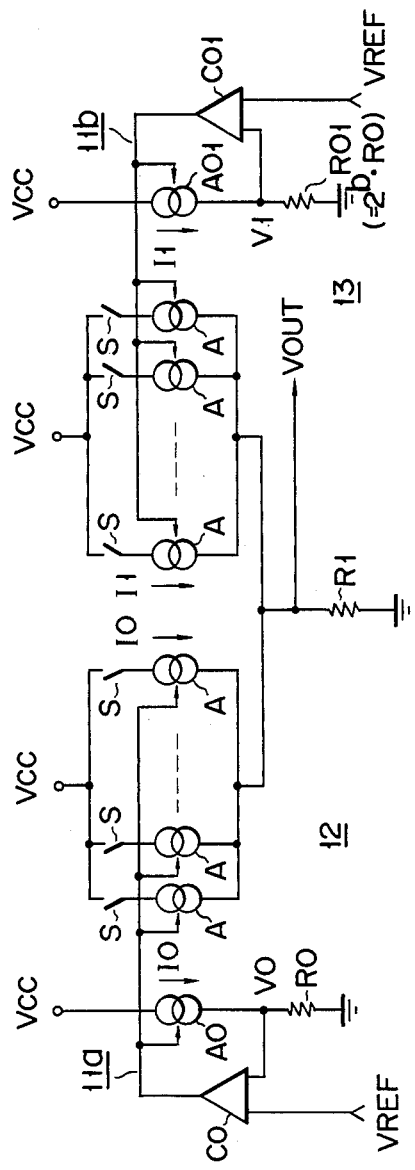
FIG. 5 is a circuit diagram showing a digital-analog converter according to a third embodiment of the present invention.

FIG. 5 illustrates a D/A converter according to a third embodiment of this invention. This D/A converter is designed such that it divides an n-bit digital signal into two parts, the first part consisting of upper a-bits, and the second part consisting of lower b-bits, then converts these two parts of the digital signal to analog signals. As is shown in FIG. 5, this D/A converter comprises two D/A converting sections, 12 and 13. Section 12 is used to convert upper a-bits to an analog signal, while section 13 converts lower b-bits to an analog signal.

D/A converting section 12 comprises $2^a-1$ switch devices S, $2^a-1$ variable current sources A, and control circuit 11a. Switch devices S are turned on or off by decoded upper a-bits. Variable current sources A are connected to switch devices S, respectively, the output current I0 of each source A being controlled by control circuit 11a.

Similarly, D/A converting section 13 comprises $2^b-1$ switch devices S, $2^b-1$ variable current sources A, and control circuit 11b. Switch devices S are turned on or off by decoded lower b-bits. Variable current sources A of section 13 are also connected to switch devices S, respectively, the output current I1 of each of these sources A being controlled by control circuit 11b.

Control circuit 11a comprises variable current source A0, resistor R0, and voltage comparator C0. Control circuit 11b comprises variable current source A01, resistor R01, and voltage comparator C01. Resistor R01 is weighted such that its resistance is $2^b \cdot R0$. Except for this point, control circuit 11b is identical in structure to control circuit 11a.

The output current I0 of each variable current source A of D/A converting section 12, and the output current I1 of each variable current source A of D/A converting section 13 are controlled to have values corresponding to reference voltage VREF. The D/A converter of third embodiment (FIG. 5) can, therefore, convert digital signals to analog signals with as high an accuracy as the D/A converters of the first and second embodiments. In addition, it is possible with the D/A converter of the third embodiment to set the full scale of analog output to a desired value, merely by changing reference voltage VREF.

Figure 6:
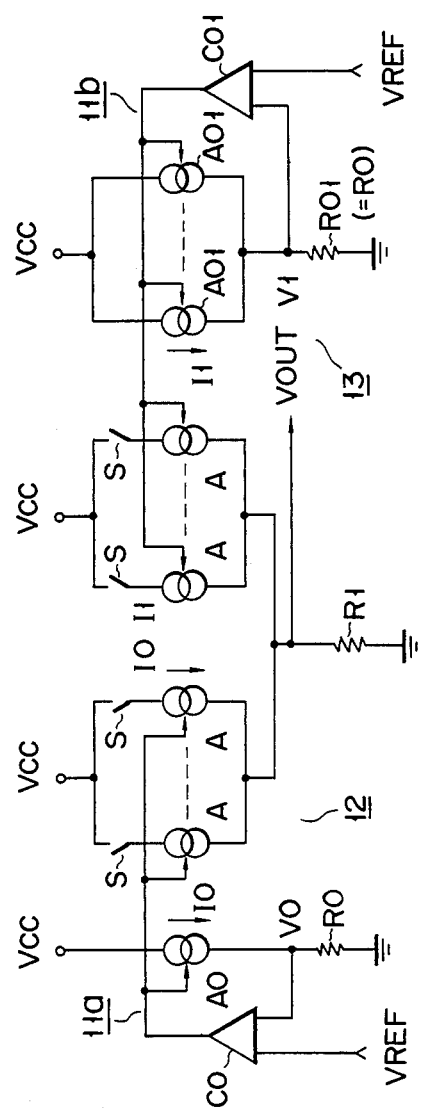
FIG. 6 is a circuit diagram illustrating a digital-analog converter according to a fourth embodiment of the invention.

FIG. 6 shows a D/A converter according to a fourth embodiment of the present invention. Like the D/A converter shown in FIG. 5, this D/A converter divides an n-bit digital signal into two parts, the first consisting of upper a-bits, and the second part consisting of lower b-bits, and converts the two parts of the digital signal to analog signals by means of D/A converting sections 12 and 13. This D/A converter is different in that circuit 11b comprises $2^b$ current sources A01 connected in parallel, instead of weighting resistor R01.

More precisely, control circuit 11b, which is designed to control the output current I1 of each variable current source of D/A converting section 13, comprises $2^b$ variable current sources A01, resistor R01, and voltage comparator C01. Current sources A01 are of the same structure as variable current sources A, and resistor R01 is identical to resistor R0. Variable current sources A01 are connected in parallel between power-supply terminal VCC and resistor R01, and are controlled by the output of voltage comparator C01, thereby to provide a current. Hence, control circuit 11b can set output current I1 of each variable current source A of D/A converting section 13 at a predetermined value.

Variable current sources A, A0, and A01 can each comprise one P-type MOS transistor, as is shown in FIG. 2, or two p-type MOS transistors, as is shown in FIG. 3. Alternatively, they can each be formed of one or two N-type MOS transistors, or of one or two bipolar transistors.

Furthermore, in the first to fourth embodiments, output resistor R1 can be dispensed with, in which case, each analog signal is output in the form of a current, thereby achieving the same advantages as in these embodiments described above.

What is claimed is:
1. A digital-to-analog converter comprising:
   a power-supply potential terminal;
   an output terminal;
   a digital-to-analog converting circuit connected to receive a digital signal, and including a plurality of serial circuits each of which has a switch device and a first variable currents source which are connected in series between said power-supply potential terminal and said output terminal, the conduction states of said switch devices being determined by the digital signal, whereby said output terminal is supplied with an analog value corresponding to the number of switch devices which are in conductive state;
   a second variable current source of substantially the same structure as said first variable current sources, and connected, at one end, to said power-supply potential terminal;
   current-to-voltage converting means for converting the output current of said second variable current source to a voltage corresponding to the output current; and
   comparator means for comparing the output voltage of said current-to-voltage converting means with a reference voltage, and controlling the output currents of said first variable current sources and the output current of said second variable current source, in accordance with the difference between the reference voltage and the output voltage of said current-to-voltage converting means.

2. A digital-to-analog converter according to claim 1, wherein said first and second variable current sources are MOS transistors of the same size and formed on the same semiconductor chip, each having a gate coupled to the output of said comparator means.

3. A digital-to-analog converter according to claim 1, wherein said first and second variable current sources each include two serially connected MOS transistors, all said MOS transistors being formed on the same semiconductor chip and being the same size, the gate of the first MOS transistor of each first current variable source and the gate of the first MOS transistor of the second variable current source being coupled to the output of said comparator means, the gate and drain of the second MOS transistor of said second variable current source being coupled to each other, the gate of the second MOS transistor of each first variable current source being connected to the node of the gate and drain of the second MOS transistor of said second variable current source.

4. A digital-to-analog converter according to claim 1, wherein said switch devices each include a P-type MOS transistor whose gate is connected to receive one bit of the decoded digital signal.

5. A digital-to-analog converter according to claim 1, wherein each of said first variable current sources is coupled, at one end, to said power-supply potential terminal, and at the other end, to one end of the corresponding switch device, the other end of which is connected to said output terminal, and also to one end of another switch device, the other end of which is connected to a ground terminal, said other switch device being turned on or off by one bit of the decoded and inverted digital signal.

6. A digital-to-analog converter according to claim 1, wherein said reference voltage has a value corresponding to the full scale of the analog output supplied from said output terminal.

* * * * *